United States Patent
Choi

(10) Patent No.: US 9,123,707 B2
(45) Date of Patent: Sep. 1, 2015

(54) METHODS FOR FORMING A HYDROGEN FREE SILICON CONTAINING DIELECTRIC FILM

(75) Inventor: Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 880 days.

(21) Appl. No.: 13/214,161

(22) Filed: Aug. 20, 2011

(65) Prior Publication Data

US 2012/0045904 A1 Feb. 23, 2012

Related U.S. Application Data

(60) Provisional application No. 61/375,643, filed on Aug. 20, 2010.

(51) Int. Cl.
*H01L 21/314* (2006.01)
*H01L 21/318* (2006.01)
(Continued)

(52) U.S. Cl.
CPC .......... *H01L 29/4908* (2013.01); *C23C 16/308* (2013.01); *C23C 16/402* (2013.01); *H01J 37/32357* (2013.01); *H01L 29/458* (2013.01); *H01L 29/66765* (2013.01); *H01L 29/7869* (2013.01); *H01L 29/78681* (2013.01); *H01L 21/02554* (2013.01); *H01L 21/02565* (2013.01); *H01L 21/02592* (2013.01); *H01L 27/1248* (2013.01); *H01L 29/78693* (2013.01)

(58) Field of Classification Search
CPC ................ C23C 16/308; C23C 16/402; H01J 37/32357; H01L 29/458; H01L 29/4908; H01L 29/66765; H01L 29/78681; H01L 29/7869; H01L 21/02554; H01L 21/02565; H01L 21/02592; H01L 29/78693; H01L 27/1214

USPC .......... 438/786, 778, 788, 792; 257/E21.266, 257/E21.278, E21.293, E21.267
See application file for complete search history.

(56) References Cited

U.S. PATENT DOCUMENTS

2002/0016084 A1\* 2/2002 Todd .............................. 438/791
2006/0019472 A1 1/2006 Pan et al.
(Continued)

OTHER PUBLICATIONS

Jun Wei et al, "Low Temperature Glass-to-Glass Wafe Bonding," IEEE Transactions on Advanced Packaging, vol. 26, No. 3, Aug. 2003, pp. 289-294.
B. Ho et al, "A 1.1 nm oxide equipment gate insulator formed using TiO2 on nitrided silicon," Electron Devices Meeting, 1998, IEDM '98 Technical Digest., International, Dec. 6, 1998, pp. 1038-1040.
PCT international search report and written opinion of PCT/US2011/047063 dated Mar. 28, 2012.

*Primary Examiner* — Walter H Swanson
(74) *Attorney, Agent, or Firm* — Patterson & Sheridan, LLP

(57) ABSTRACT

Embodiments of the disclosure generally provide methods of forming a hydrogen free silicon containing layer in TFT devices. The hydrogen free silicon containing layer may be used as a passivation layer, a gate dielectric layer, an etch stop layer, or other suitable layers in TFT devices, photodiodes, semiconductor diode, light-emitting diode (LED), or organic light-emitting diode (OLED), or other suitable display applications. In one embodiment, a method for forming a hydrogen free silicon containing layer in a thin film transistor includes supplying a gas mixture comprising a hydrogen free silicon containing gas and a reacting gas into a plasma enhanced chemical vapor deposition chamber, wherein the hydrogen free silicon containing gas is selected from a group consisting of $SiF_4$, $SiCl_4$, $Si_2Cl_6$, and forming a hydrogen free silicon containing layer on the substrate in the presence of the gas mixture.

19 Claims, 3 Drawing Sheets

(51) Int. Cl.
*H01L 21/316* (2006.01)
*H01L 29/49* (2006.01)
*C23C 16/30* (2006.01)
*C23C 16/40* (2006.01)
*H01J 37/32* (2006.01)
*H01L 29/45* (2006.01)
*H01L 29/66* (2006.01)
*H01L 29/786* (2006.01)
*H01L 21/02* (2006.01)
*H01L 27/12* (2006.01)

(56) References Cited

U.S. PATENT DOCUMENTS

2008/0035934 A1\* 2/2008 Sheppard et al. ............... 257/76
2009/0184315 A1  7/2009 Lee et al.
2010/0087052 A1\* 4/2010 Xu ............................... 438/530

\* cited by examiner

METHODS FOR FORMING A HYDROGEN FREE SILICON CONTAINING DIELECTRIC FILM

CROSS-REFERENCE TO RELATED APPLICATIONS

This application claims benefit of U.S. Provisional Application Ser. No. 61/375,643 filed Aug. 20, 2010, which is incorporated by reference in their entirety.

BACKGROUND OF THE INVENTION

1. Field of the Invention

Embodiments of the present invention generally relate to methods for forming a dielectric layer without containing hydrogen element. More particularly, this invention relates to methods for forming a hydrogen free silicon containing dielectric layer using a plasma enhanced chemical vapor deposition (PECVD) process.

2. Description of the Related Art

Display devices have been widely used for a wide range of electronic applications, such as TV, monitors, mobile phone, MP3 players, e-book readers, and personal digital assistants (PDAs) and the like. The display device is generally designed for producing desired image by applying an electric field to a liquid crystal that fills a gap between two substrates and has anisotropic dielectric constant that controls the intensity of the dielectric field. By adjusting the amount of light transmitted through the substrates, the light and image intensity, quality and power consumption may be efficiently controlled.

A variety of different display devices, such as active matrix liquid crystal display (AMLCD) or an active matrix organic light emitting diodes (AMOLED), may be employed as light sources for display devices which utilize touch screen panels. Transparent amorphous oxide semiconductor (TAOS) or metal oxide materials are widely used as semiconductor materials in display devices to improve device electrical performance. Examples of materials used for transparent amorphous oxide semiconductor (TAOS) or metal oxide materials include a-IGZO (amorphous gallium indium zinc oxide), zinc oxide, and the like. However, the transparent amorphous oxide semiconductor (TAOS) or metal oxide materials may be damaged by plasma during processing. Furthermore, hydrogen elements contained in the adjacent dielectric layers may detrimentally penetrate into the transparent amorphous oxide semiconductor (TAOS) or metal oxide materials, and may attack the transparent amorphous oxide semiconductor (TAOS) or metal oxide materials, thereby resulting in current leakage or other types of device failure. Furthermore, one of the damage may be found is the semiconductor properties may be lost and turn into a conductor due to the hydrogen donor effect.

Therefore, there is a need for a method for manufacturing the thin film transistor devices having improved electrical performance and stability.

SUMMARY OF THE INVENTION

Embodiments of the disclosure generally provide methods of forming a hydrogen free silicon containing layer using a plasma enhanced chemical vapor deposition (PECVD) process for display devices. The hydrogen free silicon containing layer may be used as a passivation layer, a gate dielectric layer, an etch stop layer, or other suitable layers in thin film transistor (TFT) devices, or other suitable display applications. In one embodiment, a method for forming a hydrogen free silicon containing layer in a thin film transistor includes supplying a gas mixture comprising a hydrogen free silicon containing gas and a reacting gas into a plasma enhanced chemical vapor deposition chamber, wherein the hydrogen free silicon containing gas is selected from a group consisting of $SiF_4$, $SiCl_4$, $Si_2Cl_6$, and forming a hydrogen free silicon containing layer on the substrate in the presence of the gas mixture.

In another embodiment, a method for forming a hydrogen free silicon containing layer in a thin film transistor includes supplying a gas mixture comprising a hydrogen free silicon containing gas and a reacting gas into a plasma enhanced chemical vapor deposition chamber, wherein the hydrogen free silicon containing gas is selected from a group consisting of $Si_{F4}$, $SiC_{l4}$, $S_{i2}C_{l6}$, wherein the hydrogen free silicon containing gas and the reacting gas is supplied at a gas flow ratio about greater than 10 by volume, and forming a hydrogen free silicon containing layer on the substrate in the presence of the gas mixture.

In yet another embodiment, a method for forming a hydrogen free silicon containing layer in a thin film transistor includes providing a substrate having an active layer formed thereon to a processing chamber, wherein the active layer is selected from a group consisting of a-IGZO (amorphous indium gallium zinc oxide), InGaZnON, ZnO, ZnON, ZnSnO, CdSnO, GaSnO, TiSnO, CuAlO, SrCuO, LaCuOS, GaN, InGaN, AlGaN or InGaAlN, supplying a gas mixture comprising a hydrogen free silicon containing gas and a reacting gas into a plasma enhanced chemical vapor deposition chamber, wherein the hydrogen free silicon containing gas is selected from a group consisting of $SiF_4$, $SiCl_4$, $Si_2Cl_6$, and forming a hydrogen free silicon containing layer on the active layer disposed on the substrate in the presence of the gas mixture.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the disclosure generally provide methods of forming a hydrogen free silicon containing layer for display devices. The hydrogen free silicon containing layer may be used as a passivation layer, a gate dielectric layer, an etch stop layer, or other suitable layers in TFT devices, OLED devices, LED devices, or other suitable display applications.

Figure 1:
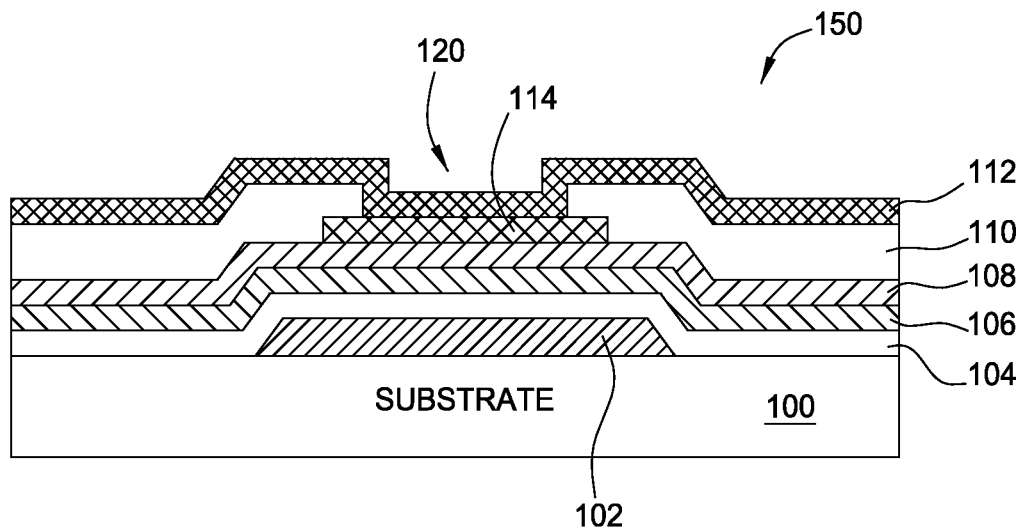
FIG. 1 is a sectional view of a thin film transistor device structure.

FIG. 1 depicts a thin film transistor device 150 disposed on a substrate 100. A gate electrode layer 102 is formed and patterned on the substrate 100 followed by a first gate insulator layer 104. A second gate insulator layer or a passivation layer 106 may be optionally formed on the first gate insulator layer 104. In one embodiment, the gate electrode layer 102 may be fabricated from any suitable metallic materials, such as aluminum (Al), tungsten (W), chromium (Cr), tantalum (Ta), molybdenum (Mo), or combination thereof. Suitable materials for the first and the second gate insulator layer 104, 106 may be silicon oxide ($SiO_2$), silicon oxynitride (SiON), silicon nitride (SiN), or the like.

An active layer 108 is formed on the second gate insulator layer 106. In embodiments wherein the second insulator layer 106 is not present, the active layer 108 may be directly formed on the first insulator layer 104. The active layer 108 may be selected from a transparent metallic oxide material that has high electron mobility as well as low temperature manufacture process requirement so that allows flexible substrate materials, such as plastic materials, to be processed at a low temperature proceeded without substrate damage. Suitable examples of the active layer 108 include a-IGZO (amorphous indium gallium zinc oxide), InGaZnON, ZnO, ZnON, ZnSnO, CdSnO, GaSnO, TiSnO, CuAlO, SrCuO, LaCuOS, GaN, InGaN, AlGaN or InGaAlN, among others.

After formation of the active layer 108, an etch stop layer 114 may be formed on the active layer 108. The etch stop layer 114 may be formed from a hydrogen free silicon containing layer similar to the first and the second gate insulator layer 104, 106. The etch stop layer 114 may be patterned to form a desired pattern on the active layer 108 to facilitate transfer of features on the film layers disposed on the substrate 100 in the subsequent etching processes. Although the etch stop layer 114 as depicted in FIG. 1 is patterned to a desired pattern, it is noted that the etch stop layer 114 could be in any form, including a whole continuous blank film in the device 150 or any different features as needed. In one embodiment, the etch stop layer 114 may be a single layer of a dielectric layer, as depicted in FIG. 1, fabricated by a silicon oxide layer, silicon nitride layer, silicon oxynitride layer, a metal dielectric layer, such as $Ta_2O_5$ or $TiO_2$, or any suitable dielectric layer as needed. In one embodiment, the etch stop layer 114 may be in form of a composite film including a first dielectric layer disposed adjust to the active layer 108 and a second dielectric layer on the first dielectric layer. As the first dielectric layer is in direct contact with the active layer 108, the first dielectric layer may be configured to be a hydrogen free dielectric layer, as manufactured by the method further discussed below with referenced to FIG. 3. The second dielectric layer may be any suitable dielectric layer, including hydrogen containing dielectric layer or hydrogen free containing layer.

After forming the etch stop layer 114, a source-drain metal electrode layer 110 is then disposed over the etch stop layer 114. Subsequently, an etching process is performed to form a channel 120 in the source-drain metal electrode layer 110 utilizing the underlying etch stop layer 114 as a blocking layer for preventing over etching to the underlying active layer 108. After etching, a passivation layer 112 is then formed over the source-drain metal electrode layer 110 covering the etch stop layer 114 to complete the process of forming the thin film transistor device 150. It is noted that the first and the second insulator layer 104, 106, the etch stop layer 114 and the passivation layer 112 may be in form of a single layer or multiple layers as needed for different devices requirements and designs.

In one embodiment, examples of the source-drain metal electrode layer 110 include copper (Cu), gold, silver (Ag), aluminum (Al), tungsten (W), molybdenum (Mo), chromium (Cr), tantalum (Ta), alloys thereof and combination thereof. Suitable examples of the etch stop layer 114 and the passivation layer 112 include silicon oxide ($SiO_2$), silicon oxynitride (SiON), or silicon nitride (SiN), and the like.

As conventional processes often use silane ($SiH_4$) gas as precursors for forming silicon containing layers in device structures, hydrogen elements originating from the silane ($SiH_4$) gas are often incorporated into the resultant silicon containing layer during the deposition process. As discussed above, hydrogen elements that may be contained in the layers, e.g., gate insulator layers, 104, 106, etch stop layer 114, or passivation layer 112, adjacent to the active layer 108 and the source-drain metal electrode layer 110 may potentially be detrimental to the electrical properties of the active layer 108. Accordingly, a hydrogen free silicon containing layer is used to form the dielectric materials in the devices 150, including the gate insulator layers 104, 106, the etch stop layer 114 or passivation layer 112 to reduce hydrogen elements contained in the thin film transistor device 150. The hydrogen free silicon containing layer may be obtained by using a hydrogen free silicon containing gas as a precursor. Details description of an exemplary process will be further discussed below with referenced to FIG. 3.

Figure 2:
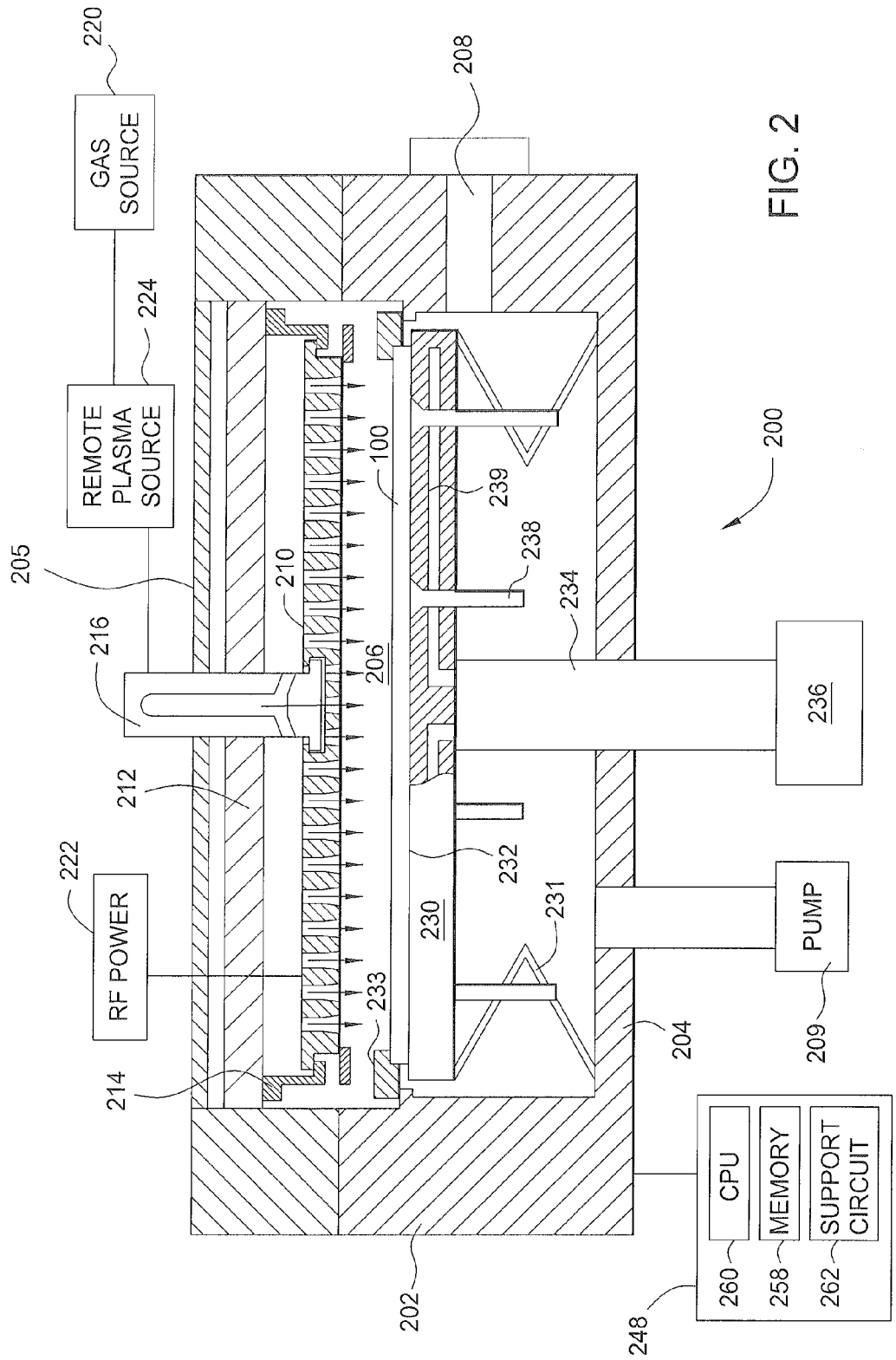
FIG. 2 depicts a sectional view of the processing chamber that may be used to deposit a hydrogen free silicon containing layer in accordance with one embodiment of the present invention.

FIG. 2 is a schematic cross-section view of one embodiment of a plasma enhanced chemical vapor deposition (PECVD) chamber (processing chamber) 200 in which the hydrogen free silicon containing layer, such as the gate insulator layers, 104, 106, the etch stop layer 114 or passivation layer 112, may be deposited. One suitable plasma enhanced chemical vapor deposition chamber is available from Applied Materials, Inc., located in Santa Clara, Calif. It is contemplated that other deposition chambers, including those from other manufacturers, may be utilized to practice the present invention.

The processing chamber 200 generally includes walls 202, a bottom 204, a lid 205 and substrate support 230 which define a process volume 206. The process volume is accessed through a valve 208 such that the substrate may be transferred in and out of the processing chamber 200. The substrate support 230 includes a substrate receiving surface 232 for supporting a substrate 100 and stem 234 coupled to a lift system 236 to raise and lower the substrate support 230. A shadow ring 233 may be optionally placed over periphery of the substrate 100. Lift pins 238 are moveably disposed through the substrate support 230 to move a substrate to and from the substrate receiving surface 232. The substrate support 230 may also include heating and/or cooling elements 239 to maintain the substrate support 230 at a desired temperature. The substrate support 230 may also include grounding straps 231 to provide an RF return path at the periphery of the substrate support 230.

A showerhead 210 is coupled to a backing plate 212 at its periphery by a suspension 214. The showerhead 210 may also be coupled to the backing plate by one or more center supports 216 to help prevent sag and/or control the straightness/curvature of the showerhead 210. A gas source 220 is coupled to the backing plate 212 to provide gas through the backing plate 212 and through the showerhead 210 to the substrate receiving surface 232. A vacuum pump 209 is coupled to the processing chamber 200 to control the process volume 206 at a desired pressure. An RF power source 222 is coupled to the backing plate 212 and/or to the showerhead 210 to provide a RF power to the showerhead 210 to create an electric field between the showerhead and the substrate support 230 so that a plasma may be generated from the gases present between the showerhead 210 and the substrate support 230. Various RF frequencies may be used, such as a frequency between about 0.3 MHz and about 200 MHz. In one embodiment the RF power source is provided at a frequency of 13.56 MHz.

A remote plasma source 224, such as an inductively coupled remote plasma source, may also be coupled between the gas source and the backing plate. Between processing substrates, a cleaning gas may be provided to the remote plasma source 224 so that a remote plasma is generated and provided to clean chamber components. The cleaning gas may be further excited by the RF power source 222 provided to the showerhead. Suitable cleaning gases include, but are not limited to, $NF_3$, $F_2$, and $SF_6$. A large area substrate having a surface area of 10,000 $cm^2$ or more, such as 40,000 $cm^2$ or more, and for example 55,000 $cm^2$ or more, is provided to the chamber on which the hydrogen free silicon layers are formed. It is understood that after processing the substrate may be cut to form smaller display devices.

In one embodiment, the heating and/or cooling elements 239 may be set to provide a substrate support temperature during deposition of about 400° C. or less, for example between about 100° C. and about 400° C., or between about 150° C. and about 300° C., such as about 200° C.

The spacing during deposition between the top surface of a substrate disposed on the substrate receiving surface 232 and the showerhead 210 may be between 400 mil and about 1,200 mil, such as between 400 mil and about 800 mil.

A controller 248 is coupled to the processing chamber 200. The controller 248 includes a central processing unit (CPU) 260, a memory 258, and support circuits 262. The controller 248 is utilized to control the process sequence, regulating the gas flows from the gas source 220 into the processing chamber 200 and controlling power supply from the RF power source 222 and the remote plasma source 224. The CPU 260 may be of any form of a general purpose computer processor that can be used in an industrial setting. The software routines can be stored in the memory 258, such as random access memory, read only memory, floppy or hard disk drive, or other form of digital storage. The support circuits 262 are conventionally coupled to the CPU 260 and may comprise cache, clock circuits, input/output subsystems, power supplies, and the like. The software routines, when executed by the CPU 260, transform the CPU into a specific purpose computer (controller) 248 that controls the processing chamber 200 such that the processes, such as the process 300 described below, are performed in accordance with the present invention. The software routines may also be stored and/or executed by a second controller (not shown) that is located remotely from the processing chamber 200.

Figure 3:
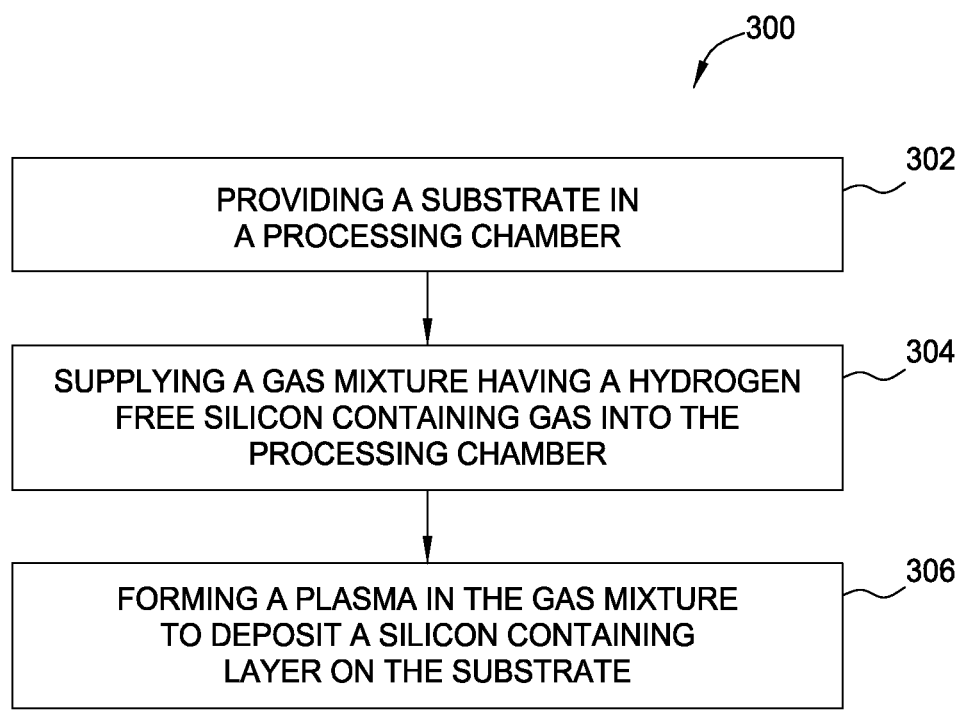
FIG. 3 depicts a process flow diagram of one embodiment of a method of forming a hydrogen free silicon containing layer in a device structure in accordance with an embodiment of the present invention.

FIG. 3 depicts a flow diagram of one embodiment of a process 300 for forming a hydrogen free silicon containing layer suitable for use as a gate insulator layer, an etch stop layer, a passivation layer or any suitable interface layer disposed in a thin-film transistor device, such as the thin-film transistor device 150 depicted in FIG. 1. The process may be practiced in the processing chamber 200, as described in FIG. 2, or other suitable processing chamber. The process 300 illustrates a method of forming a hydrogen free silicon containing layer that may be suitable for using in TFT devices, or diode devices.

The process 300 begins at step 302 by providing a substrate 100, such as the substrate 100 depicted in FIG. 1, in a process chamber, such as the processing chamber 200 depicted in FIG. 2, utilized to form a thin-film transistor device 150 thereon. The process 300 may be utilized to form a hydrogen free silicon containing layer, which may be used to form a gate insulator layer, such as the first and the second insulator layer 104, 106, an etch stop layer 114, or a passivation layer 112, as described with referenced to FIG. 1. It is noted that the substrate 100 may have different combination of films, structures or layers previously formed thereon to facilitate forming different device structures or different film stack on the substrate 100. In one embodiment, the substrate 100 may be any one of glass substrate, plastic substrate, polymer substrate, metal substrate, singled substrate, roll-to-roll substrate, or other suitable transparent substrate suitable for forming a thin film transistor thereon.

At step 304, a gas mixture is supplied into the processing chamber 200. The gas mixture comprises at least a hydrogen free silicon containing gas. The hydrogen free silicon containing gas is used as a silicon source precursor to provide silicon atoms for forming the hydrogen free silicon containing layer on the substrate. Suitable examples of the hydrogen free silicon containing gas include $SiF_4$, $SiCl_4$, $Si_2Cl_6$ or the like. Furthermore, a reacting gas is also supplied in the gas mixture to react with the hydrogen free silicon containing gas to form the desired hydrogen free silicon containing layer on the substrate. In the embodiment wherein a hydrogen free silicon oxide layer ($SiO_2$) is desired, the reacting gas is an oxygen containing gas to provide oxygen source to react with the hydrogen free silicon containing precursor for forming the hydrogen free silicon oxide layer. Suitable examples of the oxygen containing gas include $O_2$, $N_2O$, $NO_2$, $O_3$, $CO$, $CO_2$, and the like. The reacting gas may also be a hydrogen free gas. In the embodiment wherein a hydrogen free silicon nitride layer (SiN) is desired, the reacting gas is a nitrogen containing gas to provide nitrogen source for forming the hydrogen free silicon nitride layer. Suitable examples of the nitrogen containing gas include $NH_3$, $N_2$, and the like. In the embodiment wherein a hydrogen free (SiON) layer is desired, the reacting gas may be an oxygen and nitrogen containing gas to provide nitrogen and oxygen source for forming the hydrogen free silicon oxynitride layer. Suitable examples of the oxygen and nitrogen containing gas for forming silicon oxynitride include $O_2$, $N_2O$, $NO_2$, $NH_3$, $N_2$, $O_3$, $CO$, $CO_2$, combinations thereof, and the like. In one embodiment, the oxygen and nitrogen containing gas for forming silicon oxynitride includes $N_2O$, $NO_2$, or combination of $O_2$ and $NH_3$ gas or combination of $O_2$ and $N_2$ gas.

During deposition, the hydrogen free silicon containing gas and the reacting gas are supplied at a predetermined gas flow ratio. In one embodiment, the hydrogen free silicon containing gas to reacting gas flow ratio (e.g., flow volume ratio) in the gas mixture is controlled at greater than 10, such as between about 5 and about 100, or between about 20 and about 60, such as about 40. Alternatively, the hydrogen free silicon containing gas may be supplied into the process chamber at a flow rate between about 10 sccm and about 200 sccm and the reacting gas may be supplied at between about 1000 sccm and about 5000 sccm. Inert gas may also be supplied in the gas mixture. The inert gas may be supplied in the gas mixture at a flow rate between about 1000 sccm and about 5000 sccm.

At step 306, RF power is applied to the processing chamber 200 to form a plasma from the gas mixture. The RF power is also applied to maintain the plasma during deposition. In one embodiment, the RF power density may be supplied between about 100 mWatt/$cm^2$ and about 1000 mWatt/$cm^2$. The RF power is provided between about 100 kHz and about 100 MHz, such as about 350 kHz or about 13.56 MHz.

Furthermore, several process parameters may also be controlled during deposition. The spacing of the substrate to the gas distribution plate assembly may be controlled in accordance with the substrate dimension. In one embodiment, the processing spacing for a substrate having a top surface area greater than 1 square meters is controlled between about 400 mils and about 1200 mils, for example, between about 400 mils and about 850 mils, such as 580 mils. The substrate temperature may be controlled at between about 100 degrees Celsius and about 500 degrees Celsius, such as at about 250 degrees Celsius. The process pressure is maintained at between about 0.5 Torr and about 3 Torr.

Figure 4:
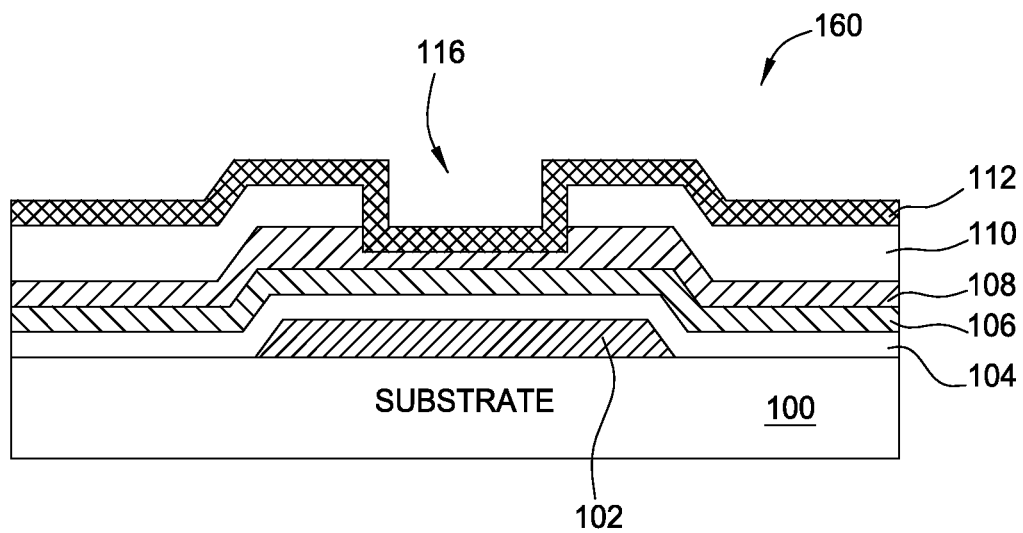
FIG. 4 is a sectional view of a thin film transistor device structure in accordance with another embodiment of the present invention.

FIG. 4 depicts another embodiment of a thin film transistor device 160 disposed on a substrate 100. Similar to the thin film transistor device structure formed on the substrate 100 depicted in FIG. 1, the thin film transistor device 160 includes a gate electrode layer 102 disposed on the substrate 100 and a first and an optional second gate insulator layer 104, 106 subsequently formed on the gate electrode layer 102. An active layer 108 is then formed on the second gate insulator layer 106. Different from the structures depicted in FIG. 1, in the thin film transistor device 160 depicted in FIG. 4, the etch stop layer is eliminated and a source-drain metal electrode layer 110 is formed on the second gate insulator layer 106.

Subsequently, a back-channel-etching (BCE) process is performed to etch or pattern the source-drain metal electrode layer 110 so as to form a channel 116 in the source-drain metal electrode layer 110 and/or maybe partially in the active layer 108 as needed. It is noted that suitable masks, such as photoresist layer or hardmask layer, may be utilized so as to transfer desired features, trenches, or channels into the source-drain metal electrode layer 110 as needed. The back-channel-etching (BCE) process may be any suitable etching processes, including dry etching, wet etching, ion plasma etching, or the like, which can form the channel 116 in the source-drain metal electrode layer 110 and/or partially in the active layer 108. The back-channel-etching (BCE) process is performed to etch the source-drain metal electrode layer 110 until a portion of the underlying active layer 108 is exposed through the channel 116 to complete the back-channel-etching (BCE) process. After the back-channel-etching (BCE) process is completed, a passivation layer 112 is then formed on the substrate 100 filling a portion of the channel 116 formed in the thin film transistor device 160. It is noted that additional process steps may be performed in any of the steps, as desired, to facilitate forming the device structure on the substrate. For example, additional process steps, such as a photoresist coating or strip process, may be performed as needed to assist transferring features to the device. In another example, additional annealing, etching, depositing, and cleaning may also be performed to facilitate forming thin film transistor devices on the substrate.

As discussed above, it is desired that the dielectric layers formed adjacent to the active layer 108 and the source-drain metal electrode layer 110 have minimum hydrogen content as possible. Accordingly, the first and the second gate insulator layers 104, 106, etch stop layer 114, and the passivation layer 112 or any suitable interface layers disposed adjacent to the active layer 108 and the source-drain metal electrode layer 110 formed in the thin film transistor device 160 may be selected to be fabricated by the process 300 described above, using hydrogen free silicon containing gas as the silicon source precursor to form any one of the first and the second gate insulator layers 104, 106, etch stop layer 114, the passivation layer 112, or any other suitable interface layer disposed adjacent to the active layer 108 and the source-drain metal electrode layer 110 in any suitable forms, including a single layer or composite layers with one or more film layer stack, as hydrogen free silicon containing layers. In one embodiment, the hydrogen free silicon containing layers may be obtained by using hydrogen free silicon containing gas, such as $SiF_4$, $SiCl_4$, $Si_2Cl_6$, or other similar hydrogen free silicon containing gas, and a reacting gas as precursors, as described in process 300 with referenced to FIG. 3.

Thus, the methods described herein advantageously improve the electronic performance and stability of the thin-film transistor devices by forming hydrogen free silicon containing layers adjacent to an active layer and a source-drain electrode layer in a thin-film transistor device.

While the foregoing is directed to embodiments of the present invention, other and further embodiments of the invention may be devised without departing from the basic scope thereof, and the scope thereof is determined by the claims that follow.

The invention claimed is:

1. A method for forming a hydrogen free silicon containing layer in a thin film transistor comprising:
   supplying a gas mixture comprising a hydrogen free silicon containing gas and a reacting gas into a plasma enhanced chemical vapor deposition chamber, wherein the hydrogen free silicon containing gas is selected from a group consisting of $SiCl_4$ and $Si_2Cl_6$, wherein the hydrogen free silicon containing gas and the reacting gas are supplied at a gas flow ratio between greater than 10:1 and about 60:1 by volume; and
   forming a hydrogen free silicon containing layer on the substrate in the presence of the gas mixture.

2. The method of claim 1, wherein the reacting gas is selected from a group consisting of $O_2$, $N_2O$, $NO_2$, $O_3$, CO and $CO_2$.

3. The method of claim 2, wherein the hydrogen free silicon containing layer is a silicon oxide layer.

4. The method of claim 1, wherein the reacting gas is selected from a group consisting of $NH_3$, and $N_2$.

5. The method of claim 4, wherein the hydrogen free silicon containing layer is a silicon nitride layer.

6. The method of claim 1, wherein the reacting gas is selected from a group consisting of $N_2O$, $NO_2$, combination of $O_2$ and $NH_3$ gas and a combination of $O_2$ and $N_2$ gas.

7. The method of claim 6, wherein the hydrogen free silicon containing layer is a silicon oxynitride layer.

8. The method of claim 1, wherein the hydrogen free silicon containing layer is a passivation layer, a gate insulator layer, an etch stop layer in a thin film transistor device.

9. The method of claim 1, wherein the hydrogen free silicon containing layer is an interface layer disposed adjacent to an active layer or a source-drain metal electrode layer formed in a thin film transistor device.

10. The method of claim 9, wherein the interface layer is a composite film having the hydrogen free silicon containing layer disposed on the active layer and a dielectric silicon containing layer disposed on the hydrogen free silicon containing layer.

11. The method of claim 10, wherein the active layer is selected from a group consisting of a-IGZO (amorphous indium gallium zinc oxide), InGaZnON, ZnO, ZnON, ZnSnO, CdSnO, GaSnO, TiSnO, CuAlO, SrCuO, LaCuOS, GaN, InGaN, AlGaN or InGaAlN.

12. The method of claim 1, wherein forming the hydrogen free silicon containing layer further comprises:
   applying a RF power in the gas mixture to form a plasma in the gas mixture, wherein the RF power is supplied at a power density between about 100 mWatt/cm$^2$ and about 1000 mWatt/cm$^2$.

13. A method for forming a hydrogen free silicon containing layer in a thin film transistor comprising:

supplying a gas mixture comprising a hydrogen free silicon containing gas and a reacting gas into a plasma enhanced chemical vapor deposition chamber, wherein the hydrogen free silicon containing gas is selected from a group consisting of $SiCl_4$ and $Si_2Cl_6$, wherein the hydrogen free silicon containing gas and the reacting gas are supplied at a gas flow ratio between about 20 and about 60 by volume; and forming a hydrogen free silicon containing layer on the substrate in the presence of the gas mixture, wherein the hydrogen free silicon containing layer is formed in a thin film transistor structure.

14. The method of claim 13, wherein the reacting gas is selected from a group consisting of $O_2$, $N_2O$, $NO_2$, $NH_3$, $N_2$, $O_3$, CO and $CO_2$.

15. The method of claim 13, wherein the hydrogen free silicon containing layer is a passivation layer, a gate insulator layer, an etch stop layer in a thin film transistor device.

16. The method of claim 13, wherein the hydrogen free silicon containing layer is an interface layer disposed adjacent to an active layer or a source-drain metal electrode layer formed in a thin film transistor device.

17. A method for forming a hydrogen free silicon containing layer in a thin film transistor comprising:

providing a substrate having an active layer formed thereon into a processing chamber, wherein the active layer is selected from a group consisting of a-IGZO (amorphous indium gallium zinc oxide), InGaZnON, ZnO, ZnON, ZnSnO, CdSnO, GaSnO, TiSnO, CuAlO, SrCuO, LaCuOS, GaN, InGaN, AlGaN or InGaAlN, supplying a gas mixture comprising a hydrogen free silicon containing gas and a reacting gas into a plasma enhanced chemical vapor deposition chamber, wherein the hydrogen free silicon containing gas is selected from a group consisting of $SiCl_4$ and $Si_2Cl_6$, wherein the hydrogen free silicon containing gas and the reacting gas are supplied at a gas flow ratio between about 20 and about 60 by volume; and forming a hydrogen free silicon containing layer on the active layer disposed on the substrate in the presence of the gas mixture.

18. The method of claim 17, wherein reacting gas is selected from a group consisting of $O_2$, $N_2O$, $NO_2$, $NH_3$, $N_2$, $O_3$, CO and $CO_2$.

19. A method for forming a hydrogen free silicon containing layer in a thin film transistor comprising:

performing a deposition process on a substrate having a film stack formed in a thin film transistor disposed in a processing chamber, the film stack includes an interface layer disposed between an active layer and a dielectic silicon containing layer, wherein the active layer is selected from a group consisting of a-IGZO (amorphous indium gallium zinc oxide), InGaZnON, ZnO, ZnON, ZnSnO, CdSnO, GaSnO, TiSnO, CuAlO, SrCuO, LaCuOS, GaN, InGaN, AlGaN or InGaAlN, wherein the deposition process is performed by:

supplying a gas mixture comprising a hydrogen free silicon containing gas and a reacting gas into a plasma emhanced chemical vapor deposition chamber, wherein the hydrogen free silicon containing gas is selected from a group consisting of $SiF_4$, $SiCl_4$ and $Si_2Cl_6$, wherein the hydrogen free silicon containing gas and the reacting gas are supplied at a gas flow ratio between greater than 10:1 and about 60:1 by volume; and forming a hydrogen free silicon containing layer on the active layer disposed on the substrate in the presence of the gas mixture.

* * * * *

UNITED STATES PATENT AND TRADEMARK OFFICE
CERTIFICATE OF CORRECTION

PATENT NO. : 9,123,707 B2
APPLICATION NO. : 13/214161
DATED : September 1, 2015
INVENTOR(S) : Soo Young Choi Page 1 of 1

It is certified that error appears in the above-identified patent and that said Letters Patent is hereby corrected as shown below:

In the Claims:

Column 8, Claim 1, Line 29, please delete "the" and insert -- a -- therefor;

Column 8, Claim 6, Line 41, please insert -- a -- before combination;

Column 8, Claim 12, Line 62, please insert -- the -- before forming;

Column 9, Claim 13, Line 11, please delete "the" and insert -- a -- therefor;

Column 10, Claim 18, Line 9, please insert -- the -- before reacting;

Column 10, Claim 19, Line 17, please delete "dielectic" and insert -- dielectric -- therefor;

Column 10, Claim 19, Line 26, please delete "emhanced" and insert -- enhanced -- therefor.

Signed and Sealed this
Fifth Day of July, 2016

Michelle K. Lee
*Director of the United States Patent and Trademark Office*